(12) United States Patent
Chumakov

(10) Patent No.: US 8,420,479 B2
(45) Date of Patent: Apr. 16, 2013

(54) SEMICONDUCTOR DEVICE COMPRISING A CAPACITOR FORMED IN THE CONTACT LEVEL

(75) Inventor: Dmytro Chumakov, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 191 days.

(21) Appl. No.: 12/942,378

(22) Filed: Nov. 9, 2010

(65) Prior Publication Data

US 2011/0241166 A1 Oct. 6, 2011

(30) Foreign Application Priority Data

Mar. 30, 2010 (DE) .......................... 10 2010 003 452

(51) Int. Cl.
*H01L 21/8242* (2006.01)

(52) U.S. Cl.
USPC ........... 438/243; 438/239; 438/689; 257/296; 257/E21.088

(58) Field of Classification Search .................. 438/689, 438/243, 239; 257/296, E21.088
See application file for complete search history.

(56) References Cited

U.S. PATENT DOCUMENTS

2002/0132413 A1* 9/2002 Chang et al. .................. 438/211

FOREIGN PATENT DOCUMENTS

DE 10 2004 004 584 A1 8/2005
GB 2 331 839 A 6/1999

OTHER PUBLICATIONS

Translation of Official Communication from German Patent Application No. 10 2010 003 452.5 dated Jan. 7, 2011.

* cited by examiner

*Primary Examiner* — Eva Yan Montalvo
(74) *Attorney, Agent, or Firm* — Williams, Morgan & Amerson

(57) ABSTRACT

A contact level in a semiconductor device may be used for providing a capacitor that may be directly connected to a transistor, thereby providing a very space-efficient capacitor/transistor configuration. For example, superior dynamic RAM arrays may be formed on the basis of the capacitor/transistor configuration disclosed herein.

11 Claims, 10 Drawing Sheets

SEMICONDUCTOR DEVICE COMPRISING A CAPACITOR FORMED IN THE CONTACT LEVEL

BACKGROUND OF THE INVENTION

1. Field of the Invention

The present disclosure generally relates to the field of fabricating integrated circuits, and, more particularly, to forming capacitors in the metallization system, such as capacitors for dynamic random access memories (DRAMs), decoupling capacitors and the like.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance while, however, increasing dynamic power consumption of the individual transistors. That is, due to the reduced switching time interval, the transient currents upon switching a MOS transistor element from logic low to logic high are significantly increased.

In addition to the large number of transistor elements, a plurality of passive circuit elements, such as capacitors, are typically formed in integrated circuits that are used for a plurality of purposes, such as charge storage for storing information, for decoupling and the like. Decoupling in integrated circuits is an important aspect for reducing the switching noise of the fast switching transistors, since the decoupling capacitor may provide energy at a specific point of the circuitry, for instance at the vicinity of a fast switching transistor, and thus reduce voltage variations caused by the high transient currents which may otherwise unduly affect the logic state represented by the transistor.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed which may include different types of circuits, such as analog circuits, digital circuits and the like, thereby providing entire systems on a single chip (SoC). Furthermore, in sophisticated microcontroller devices, an increasing amount of storage capacity may be provided on chip within the CPU core, thereby also significantly enhancing the overall performance of modern computer devices. For example, in typical micro-controller designs, different types of storage devices may be incorporated so as to provide an acceptable compromise between die area consumption and information storage density versus operating speed. For instance, fast or temporary memories, so-called cache memories, may be provided in the vicinity of the CPU core, wherein respective cache memories may be designed so as to allow reduced access times compared to external storage devices. Since a reduced access time for a cache memory may typically be associated with a reduced storage density thereof, the cache memories may be arranged according to a specified memory hierarchy, wherein a level 1 cache memory may represent the memory formed in accordance with the fastest available memory technology. For example, static RAM memories may be formed on the basis of registers, thereby enabling an access time determined by the switching speed of the corresponding transistors in the registers. Typically a plurality of transistors may be required so as to implement a corresponding static RAM cell, thereby significantly reducing the information storage density compared, for instance, to dynamic RAM (DRAM) memories including a storage capacitor in combination with a pass transistor. Thus, a higher information storage density may be achieved with DRAMs, although at an increased access time compared to static RAMs, which may nevertheless render dynamic RAMs attractive for specific less time-critical applications in complex semiconductor devices. For example, typical cache memories of level 3 may be implemented in the form of dynamic RAM memories so as to enhance information density within the CPU, while only moderately sacrificing overall performance.

Frequently, the storage capacitors may be formed in the transistor level using a vertical or planar configuration. While the planar architecture may require significant silicon area for obtaining the required capacitance values, the vertical arrangement may necessitate complex patterning regimes for forming the trenches of the capacitors.

For these reasons, in other approaches, capacitors may also be implemented in the metallization system of the semiconductor device, i.e., in the metallization layers comprising metal lines and vias, wherein, however, typically, significant modifications of the overall process flow may be required so as to implement the metal capacitors in the metallization system and to provide the corresponding interconnect structure for connecting the metal capacitors with the circuit elements in the device level, such as transistors and the like. Consequently, also in this case, additional process modules may have to be implemented into the overall process flow, which may thus contribute to additional process complexity.

In many cases, capacitive structures may be required in the immediate vicinity of circuit elements, such as transistors, which may be accomplished in some conventional approaches, for instance in view of providing a high bit density in dynamic RAM areas by providing deep trench capacitors in the semiconductor substrate and providing corresponding transistors in and around the deep trench capacitors. As pointed out above, although a space-efficient configuration may be achieved, nevertheless, extremely complicated processes, in particular for patterning the deep trenches for the capacitors in the semiconductor substrate, may be required, which may also be different for bulk devices and SOI devices, so that, in total, significant process-related variations may be introduced in complex semiconductor devices. On the other hand, providing the capacitors in the metallization system may provide additional interconnect complexity combined with sophisticated process modules for forming the capacitors independently from the regular metal interconnect structures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which capacitive structures may be efficiently provided in the contact level of the semiconductor device, i.e., in the device level that represents an interface between the semiconductor-based circuit elements, such as the transistors, and the actual metallization system. Moreover, the capacitors may be provided such that a very efficient electrical connection to the semiconductor-based circuit elements, such as transistors, may be accomplished, i.e., one of the capacitor electrodes may be in direct contact with a contact region of a transistor, such as a drain region or a source region, while at the same time a high degree of compatibility with conventional contact regimes may be preserved. In some illustrative embodiments disclosed herein, the capacitive structures or capacitors may be provided as contact elements, a portion of which may be formed together with other regular contact elements, thereby providing an efficient overall manufacturing flow in combination with a space-efficient configuration, while at the same time reducing complexity and contact resistance between the capacitor and the circuit element, such as a transistor.

One illustrative method disclosed herein comprises forming a first opening in a dielectric material of a contact level of a semiconductor device, wherein the first opening connects to a first contact region of a transistor. The method further comprises forming a conductive material and a capacitor dielectric material on inner surface areas of the first opening and forming a second opening in the dielectric material so as to connect to a second contact region of the transistor. Additionally, the method comprises forming a conductive material in the first and second openings.

A further illustrative method disclosed herein relates to forming a capacitive structure of a semiconductor device. The method comprises forming an opening in a dielectric layer so as to connect to one of a drain region and a source region of a transistor. The method further comprises forming a capacitor in the opening, wherein the capacitor has a first electrode connected to the at least one of a drain region and a source region.

One illustrative semiconductor device disclosed herein comprises a transistor formed in and above a semiconductor region, wherein the transistor comprises a first contact region and a second contact region that are formed in the semiconductor region. The semiconductor device further comprises a contact level comprising a dielectric material and a contact element formed in the dielectric material and connecting to the first contact region. The semiconductor device further comprises a capacitor formed in the dielectric material and having a first electrode connected to the second contact region.

BRIEF DESCRIPTION OF THE DRAWINGS

The disclosure may be understood by reference to the following description taken in conjunction with the accompanying drawings, in which like reference numerals identify like elements, and in which.

Figure 1A:
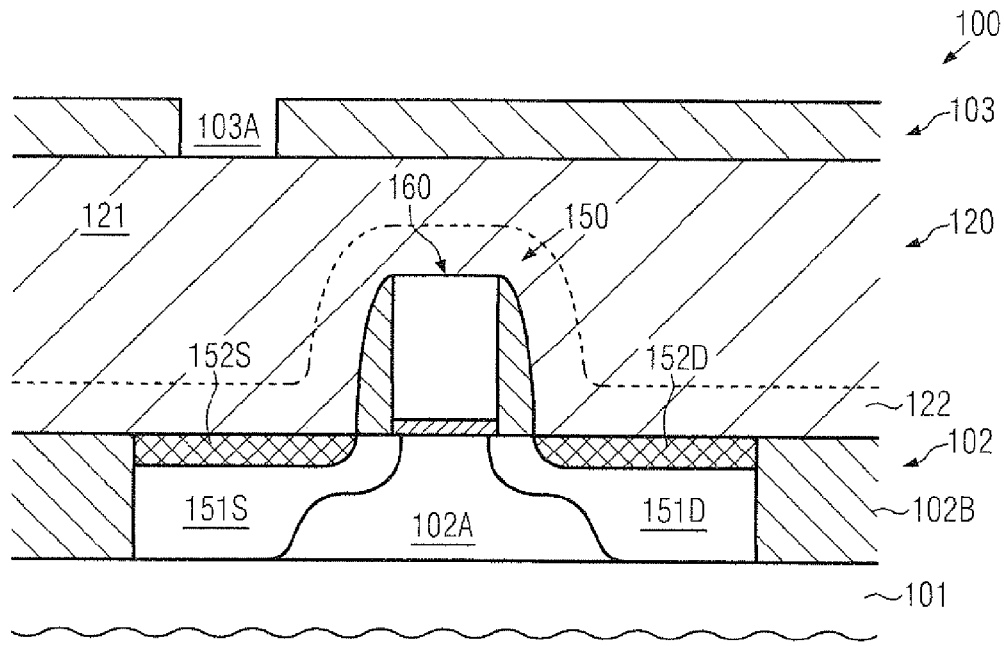
FIGS. 1a-1g schematically illustrate cross-sectional views of a semiconductor device during various manufacturing stages in forming a capacitor in the contact level of the semiconductor device so as to be in contact with a transistor, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which capacitors or capacitive structures may be formed in the contact level of the semiconductor device so as to directly connect to the contact region of a circuit element, such as a transistor, thereby providing a very space-efficient configuration and reducing the complexity of any interconnect structure in order to connect a transistor and a capacitor. In this manner, the capacitor/transistor configuration may be used in memory areas requiring a storage transistor, such as dynamic RAM arrays and the like, wherein a high bit density may be obtained on the basis of reduced process complexity for providing the storage capacitors. In other cases, the capacitor/transistor configuration may be used in other situations in which an increased capacitance may be required at or in the vicinity of a transistor element, such as certain capacitive circuit portions and the like.

In some illustrative embodiments the capacitor may be implemented on the basis of a patterning regime in which the opening of one contact element, which is to receive the capacitive structure, may be patterned independently from any contact openings used for regular contact elements, wherein only one additional lithography process may be required. To this end, the capacitive structure may be completed prior to actually patterning the contact openings of the regular contact elements, while, in other illustrative embodiments, several process steps may be performed commonly for the capacitive structure and the regular contact elements, such as filling the contact elements with an appropriate conductive material and the like.

In other illustrative embodiments, the capacitor opening and the contact openings may be patterned in a common process sequence and the capacitor electrode that is in direct contact with the transistor contact region and the capacitor dielectric may be formed on the basis of an additional lithography process, which, however, may be less critical with respect to alignment accuracy and the like. To this end, appropriate sacrificial materials may be efficiently used for forming the capacitive structure and the contact elements in a common process sequence without introducing undue process complexity.

In still other illustrative embodiments, the basic patterning regimes as described above may also be applied to sophisticated replacement gate approaches, wherein at least some process steps may be performed commonly for the sophisticated high-k metal gate electrode structure and the capacitor to be formed in the contact level.

FIG. 1a schematically illustrates a cross-sectional view of a semiconductor device 100 comprising a substrate 101, above which may be provided a semiconductor layer 102, such as a silicon layer, a silicon/germanium layer and the like. The semiconductor layer 102 may have any appropriate material composition and thickness so as to form circuit elements, such as transistors therein and thereabove. In some illustrative embodiments, a buried insulating layer (not shown) may be provided below the semiconductor layer 102, thereby forming a silicon-on-insulator (SOI) configuration. In other cases, the semiconductor layer 102 may represent a portion of a crystalline semiconductor material of the substrate 101, thereby forming a bulk configuration. The semiconductor layer 102 may comprise appropriate isolation structures 102B, for instance in the form of shallow trench isolations and the like, which may laterally delineate semiconductor regions or active regions, wherein, for convenience, a semiconductor region 102A is illustrated in FIG. 1a. An active region is to be understood as a semiconductor region in which PN junctions for one or more transistors are formed or are to be formed. Furthermore, in the manufacturing stage shown, a transistor 150 may be formed in and above the active region 102A and may comprise a gate electrode structure 160, which may have any appropriate configuration in terms of lateral dimensions, height, material composition and the like, so as to allow the control of a current flow between a source region 151S and a drain region 151D, which are formed in the active region 102A. It should be appreciated that the transistor 150 may represent a planar transistor configuration in the form of a field effect transistor, while, in other cases, any other transistor architecture may be used, as long as corresponding contact regions 152S, 152D have to be contacted by contact elements and wherein at least one component, such as the drain region 151D and/or the source region 151S, may require an electrical connection to a capacitive structure. In the embodiment shown, the contact regions 152S, 152D may be realized on the basis of a metal silicide if the drain and source regions 151S, 151D may comprise a significant amount of silicon material. Furthermore, the transistor 150 may represent a sophisticated planar transistor element having lateral dimensions, for instance, in the gate electrode structure 160 of 50 nm and less. Moreover, the semiconductor device 100 may comprise a contact level or layer 120, which is to be understood as a contact level that may passivate the transistor 150 while at the same time providing electrical contact to a metallization system (not shown) that may have to be established above the contact level 120. For example, the contact level 120 may comprise one or more appropriate dielectric materials, such as a dielectric material 122, for instance in the form of silicon nitride and the like, in combination with a further dielectric material 121, such as silicon dioxide and the like. It should be appreciated, however, that any appropriate materials may be provided in the contact level 120 as long as the required electrical insulation, passivation and mechanical integrity of the transistor 150 may be guaranteed. Furthermore, in the manufacturing stage shown, an etch mask 103 may be provided above the contact level 120 and may be comprised of any appropriate material or material system in order to enable the patterning of the dielectric material or materials 121, 122 of the contact level 120. For example, the etch mask 103 may comprise a resist material, hard mask material, anti-reflective coating (ARC) material and the like, as required for the further processing of the device 100. A mask opening 103A may thus correspond to the lateral size and position of a capacitor opening that is to be formed in the dielectric materials 121, 122 so as to connect to the contact region 152S if a corresponding capacitor is to be formed so as to be in contact with the source region 151S. As indicated above, however, a corresponding opening may be formed to the contact region 152D, depending on the overall circuit layout, while, in other cases, both contact regions 152S, 152D may receive a capacitive structure, if required. In other illustrative embodiments, as will be described later on in more detail, the etch mask 103 may comprise appropriate mask openings for any other regular contact openings to be formed so as to connect to the transistor 150.

The semiconductor device 100 as illustrated in FIG. 1a may be formed on the basis of the following process techniques. The active region 102A may be formed by providing the isolation structure 102B, which may include well-established process strategies using sophisticated lithography, etch, deposition, planarization techniques and the like. Prior to or after providing the isolation structure 102B, any appropriate dopant species may be incorporated into the active region 102A followed by the formation of the gate electrode structure 160, which may be accomplished by any appropriate process strategy. Next, the drain and source regions 151D, 151S may be formed, for instance, by ion implantation and the like in combination with appropriate anneal processes in order to define the desired final dopant profile in the active region 102A. If required, any further mechanisms may be implemented in order to enhance performance of the transistor 150, if required. For example, a strain may be induced at least in a portion of the active region 102A so as to modify the charge carrier mobility, which may result in superior performance of the transistor 150. Thereafter, a metal silicide may be formed in the drain and source regions 151D, 151S, if required, and possibly also in the gate electrode structure 160 (not shown), depending on the overall configuration of the gate electrode structure 160. Thereafter, the contact level 120 may be formed by depositing one or more materials, as required, for instance in the form of the material layers 122 and 121. If required, additional planarization processes may be performed so as to provide a substantially planar surface topography for forming the etch mask 103 on the basis of appropriate lithography masks in order to define the size and position of the mask opening 103A and thus of a capacitor opening to be formed in the contact level 120. As indicated above, the etch mask 103 may be formed on the basis of resist material, hard mask materials and the like. Next, an etch sequence may be performed on the basis of the etch mask 103 using well-established plasma-assisted etch recipes in order to transfer the mask opening 103A into the dielectric material 121. If provided, the material 122 may be used as an etch stop layer, which may be subsequently opened on the basis of an appropriate etch process, wherein well-established recipes may be used. For example, any appropriate patterning regime may be applied, as may be used in conventional strategies for forming contact openings in the contact level of a semiconductor device.

Figure 1B:
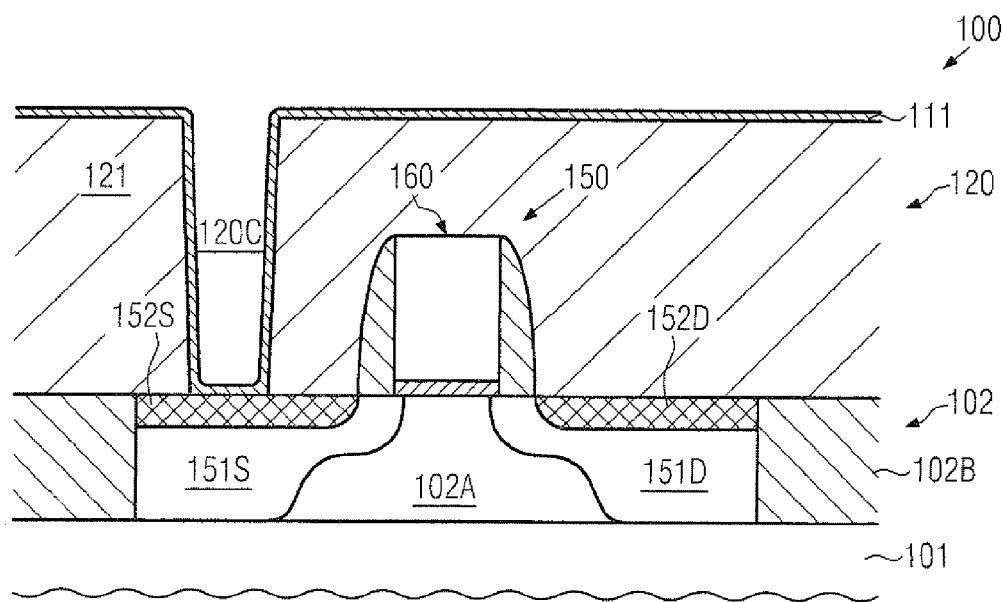

FIG. 1b schematically illustrates the semiconductor device 100 in a further advanced manufacturing stage. As illustrated, an opening 120C may be provided so as to extend through the contact level 120 and connect to the contact region 152S, while a conductive electrode material 111 may be formed above the contact level 120 and within the opening 120C. The conductive material 111 may be provided in the form of any appropriate conductive material, such as a highly doped semiconductor material, a metal-containing material in the form of nitrides, such as titanium nitride, tantalum nitride and the like, while, in other cases, a metal material may be provided, for instance in the form of tungsten, aluminum and the like. Consequently, the electrode material 111 may be in direct contact with the contact region 152S and may represent a first electrode of a capacitor to be formed in the opening 120C. The material 111 may be deposited on the basis of any appropriate deposition technique, such as chemical vapor deposition (CVD), physical vapor deposition, such as sputter deposition, electrochemical deposition and the like, depending on the overall process requirements and the material composition of the layer 111. Thus, a plurality of well-established process techniques and recipes are available for forming the material 111.

After the deposition of the material 111, the further processing may be continued by removing the material 111, at least outside of the opening 120C, which may be accomplished, for instance, by forming an etch mask so as to cover the opening 120C and removing any exposed portions of the material 111. In other illustrative embodiments a sacrificial fill material may be provided, for instance in the form of a polymer material, which may be applied in a low viscous state and which may thus fill the opening 120. Thereafter, any appropriate removal process may be performed, such as an etch process, a chemical mechanical polishing (CMP) process and the like. In this case, the fill material in the opening 120C may preserve integrity of the material 111 while removing any other portions from the contact level 120.

Figure 1C:
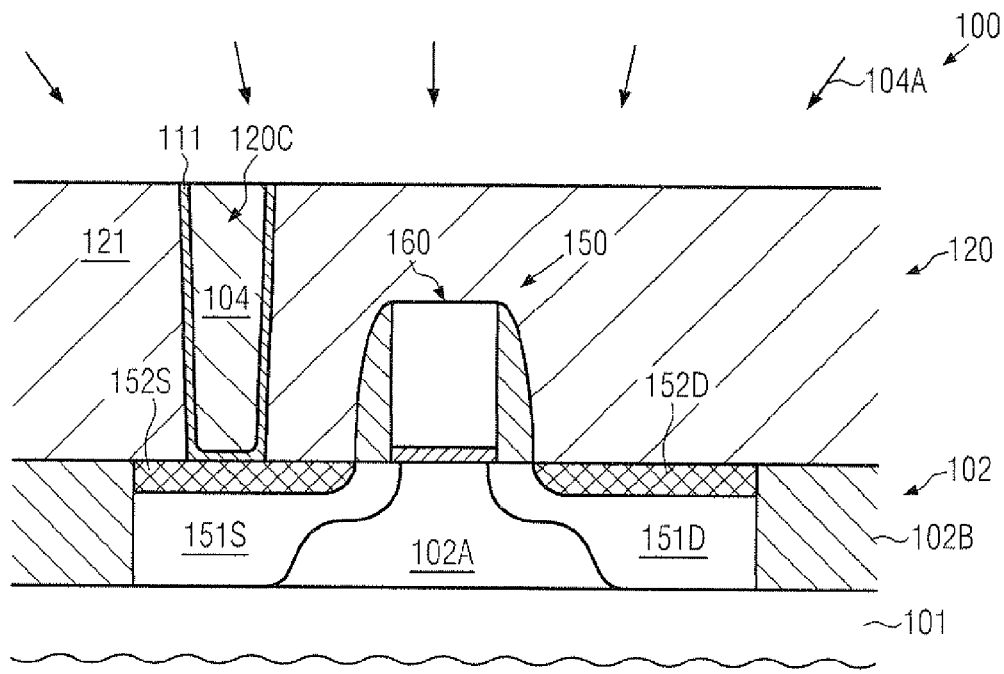

FIG. 1c schematically illustrates the semiconductor device 100 in an advanced manufacturing stage in which a sacrificial fill material 104 may still be present in the opening 120C, thereby covering the material 111, which may be removed outside of the opening 120C, for instance on the basis of one or more of the process strategies described above. In this manufacturing stage, the device 100 may be exposed to a reactive process ambient 104A which may be appropriately configured so as to remove the sacrificial fill material 104 without unduly affecting other materials of the device 100. For example, a plurality of plasma-assisted processes for removing polymer material, such as oxygen plasma processes and the like or wet chemical etch processes, are well established and may be used so as to remove the fill material 104 selectively with respect to the dielectric material of the contact level 120 and the electrode material 111. If required, any additional wet chemical cleaning processes may be performed so as to remove any residues of the sacrificial fill material 104.

Figure 1D:
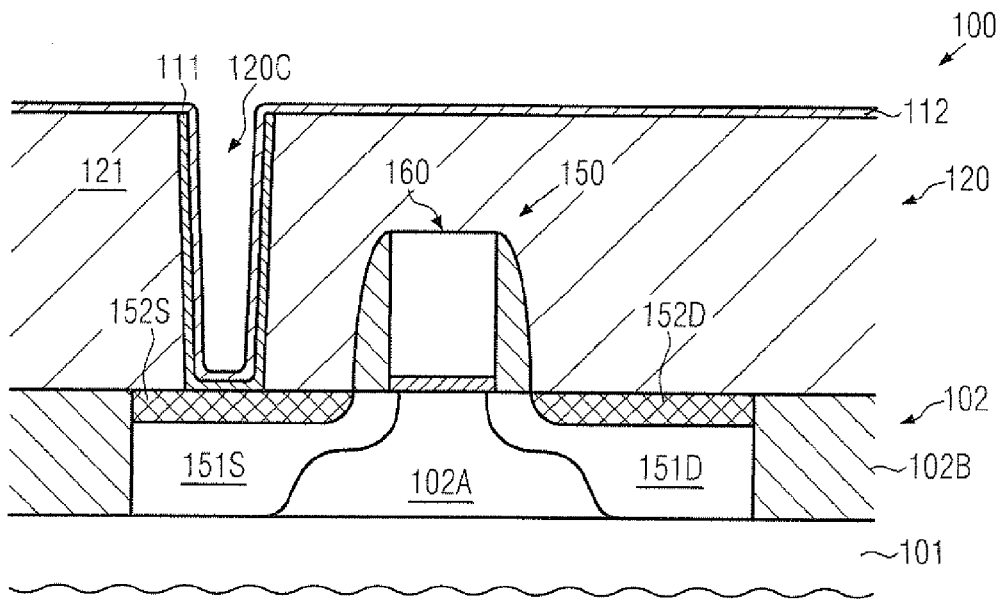

FIG. 1d schematically illustrates the semiconductor device 100 in a further advanced manufacturing stage in which a dielectric material 112 may be formed on the contact level 120 and within the opening 120C, which may have any appropriate material composition and thickness so as to act as a capacitor dielectric material after completing a capacitive structure in the opening 120C. For example, the material 112 may comprise silicon dioxide, silicon nitride, nitrogen-enriched silicon carbide, high-k dielectric materials, if the dielectric constant may be compatible with the further processing of the device 100, and the like. The layer 112 may be formed with an appropriate thickness for a given material composition, for instance in the range of one to several nanometers, thereby adjusting the effective capacitance of a capacitor still to be completed in the opening 120C. It should be appreciated that, generally, the capacitance of a capacitor may be defined by the effective electrode area, the distance between the electrodes and dielectric characteristics of the dielectric material formed therebetween. Consequently, the effective capacitance of a capacitor to be formed in the opening 120C may be adjusted on the basis of the size and shape of the opening 120C, which may be provided in the form of a trench or of any other opening having similar dimensions in any lateral direction, for instance in the form of a square-like opening and the like, which may be advantageous in increasing the total area of any inner surface areas of the opening 120C. For example, a plurality of openings, such as the opening 120C, may be provided along a transistor width direction, i.e., a direction perpendicular to the drawing plane of FIG. 1d, which may result, in total, in an increased surface area compared to a single trench-like opening, which may extend along the transistor width direction. Moreover, for a given configuration of the opening 120C, the dielectric constant of the material 112 and the thickness thereof may also enable an efficient adjustment of the finally obtained capacitance. Consequently, superior flexibility in adjusting the capacitance value of the capacitive structure is achieved by defining the lateral dimensions of the opening 120C for a given height of the contact level 120 and by selecting thickness and material composition of the dielectric layer 112. In the embodiment shown, the dielectric material 112 may be partially preserved on the contact level 120 during the further processing, while, in other illustrative embodiments, as will be described later on in more detail, the material 112 may be removed from a contact level 120, thereby enabling the application of even high-k dielectric materials, i.e., dielectric materials having a dielectric constant of 10.0 and higher, without significantly affecting the overall capacitance of the contact level 120. After forming the layer 112, in some illustrative embodiments, the further processing may be continued by providing a further sacrificial fill material so as to fill the opening 120C and provide a superior surface topography prior to subsequent lithography processes.

Figure 1E:
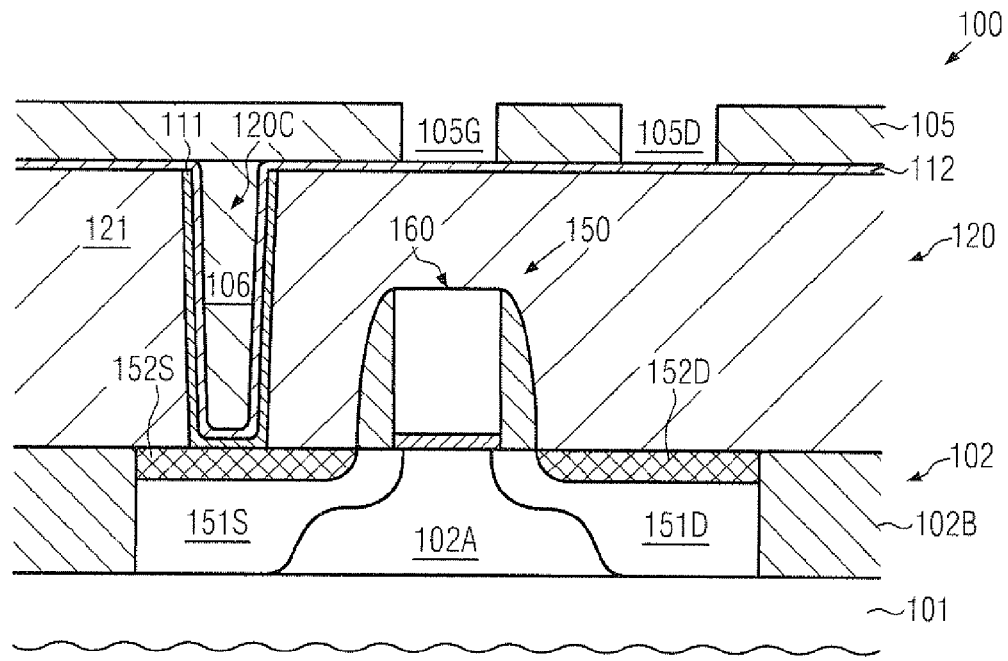

FIG. 1e schematically illustrates the semiconductor device 100 with a sacrificial fill material 106 provided in the opening 120C, while a further etch mask 105 may be formed above the contact level 120 and may comprise mask openings 105G, 105D, which may thus define the lateral size and position of regular contact openings to be formed in the contact level 120 so as to connect to the transistor 150. With respect to the etch mask 105, the same criteria may apply as previously explained with reference to the etch mask 103 (FIG. 1a). Next, any appropriate etch sequence may be applied so as to etch through the contact level 120, including the layer 112, which may be accomplished by using any appropriate process strategy, such as conventional patterning regimes and the like.

Figure 1F:
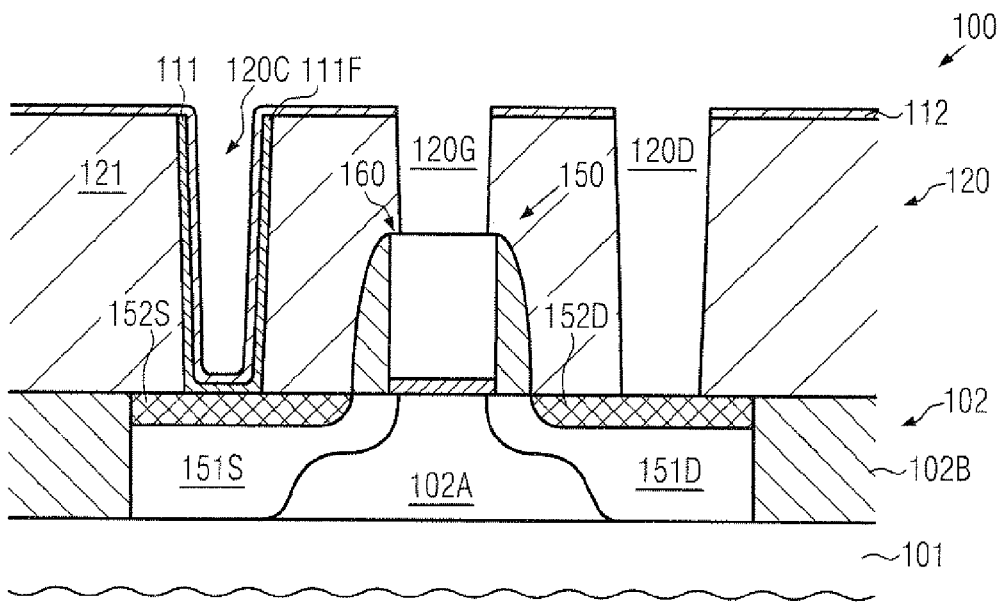

FIG. 1f schematically illustrates the semiconductor device 100 in a further advanced manufacturing stage, i.e., after performing the above-described etch process, thereby forming contact openings 120G, 120D and after the removal of the etch mask 105 of FIG. 1e. Moreover, the sacrificial material 106 (FIG. 1e) is removed from the opening 120C. Consequently, the contact opening 120G may connect to the gate electrode structure 160, while the contact opening 120D may connect to the contact region 152D and may thus represent openings for forming regular contact elements therein. On the other hand, the opening 120C comprises the electrode material 111 and the dielectric material 112, a portion of which may still cover end faces 111F of the electrode material 111 even if a certain material consumption may have occurred upon a previous patterning process. That is, the initial thickness of the layer 112 may be reduced above horizontal areas of the contact level 120, while the initial thickness of the material 112 within the opening 120C may have been substantially preserved during the previous processing.

Figure 1G:
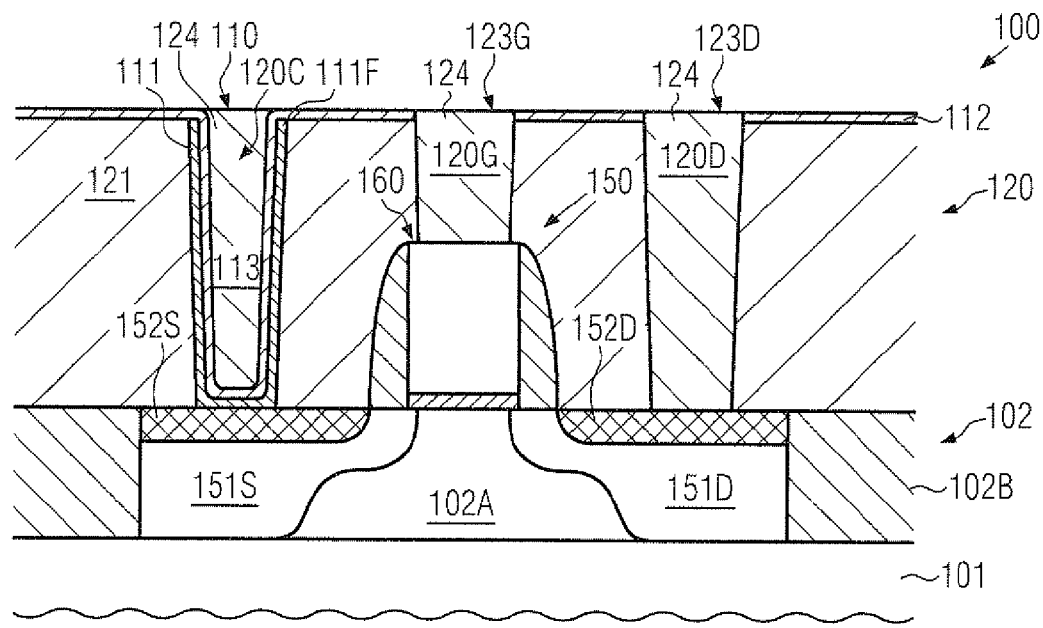

FIG. 1g schematically illustrates the semiconductor device 100 in a further advanced manufacturing stage. As illustrated, the device 100 may comprise a contact element 123G formed on the basis of the contact opening 120G and may include any appropriate material or material system 124 that is compatible with the device requirements. For example, the material 124 may comprise tungsten, aluminum, copper and the like, possibly in combination with appropriate barrier and/or seed materials (not shown), depending on the overall process and device requirements. Similarly, a contact element 123D may be provided on the basis of the contact opening 120D and may connect to the contact region 152D. Furthermore, a capacitor or capacitive structure 110 may be provided within the opening 120C and may comprise the material or material system 124 as a capacitor electrode which is separated from the material 111, acting as a further capacitor electrode by the dielectric material 112. Furthermore, a remaining portion of the material 112 formed on horizontal areas of the device level 120 may still reliably confine the end faces 111F of the electrode material 111.

The semiconductor device 100 as illustrated in FIG. 1g may be formed on the basis of any appropriate process strategy in order to provide the material or material system 124, for instance on the basis of CVD for tungsten-based materials, electrochemical deposition, possibly in combination with CVD techniques for providing a seed layer and the like. After filling the openings 120C, 120G, 120D with the material or material system 124, any excess material may be removed, for instance, by electro etching, electro CMP, CMP and the like, wherein the material 112 still provided on the contact level 120 may act as an efficient stop material. Consequently, the contact elements 123G, 123D and one electrode of the capacitor 110 may be provided in a common process sequence, thereby avoiding any undue process complexity. Thereafter, the processing may be continued by forming a metallization system above the contact level 120, wherein the regular contact elements 123G and 123D may connect to appropriate metal lines of the very first metallization layer of the corresponding metallization system, while also an electrode 113, represented by the material 124 of the capacitor 110, may also act as a contact element so as to directly connect to an appropriate metal line of the very first metallization layer still to be formed above the contact level 120. On the other hand, the electrode 111 which may be reliably confined by the electric material 112 may directly connect to the contact region 152S, thereby providing a very space-efficient and low ohmic interconnect regime for connecting the capacitor 110 and the transistor 150.

Figure 1H:
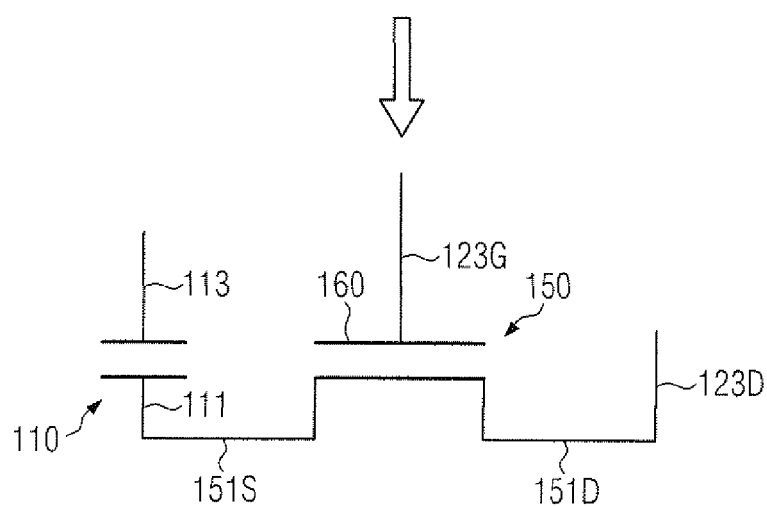
FIG. 1h schematically illustrates a circuit diagram of the transistor/capacitor configuration as shown in FIG. 1g.

FIG. 1h schematically illustrates a circuit diagram of the capacitor/transistor configuration as shown in FIG. 1g. As shown, the transistor 150 comprises the gate electrode structure 160, which may be connected to other circuit elements via the contact element 123G and corresponding metal features in the metallization system (not shown). Similarly, the drain region 151D may be contacted via the contact element 123D in accordance with any desired circuit layout. On the other hand, the capacitor 110 may be directly connected to the source region 151S via the electrode 111, while the other capacitor electrode 113 may be contacted by the metallization system since the electrode 113 may act as a contact element, as explained above with reference to FIG. 1g. It should be appreciated that any other circuit configuration may be realized, for instance the capacitor 110 may directly connect to the drain region 151D, if required, or two or more capacities may be connected to the transistor 150, for instance by providing an additional capacitor between the gate electrode structure 160 and one or both of the transistor regions 151S, 151D. Thus, any appropriate capacitor/transistor configuration may be used so as to form more complex circuit portions, depending on the overall requirements. In some illustrative embodiments, the capacitor/transistor configuration as shown in FIG. 1h may be efficiently used in a memory array which may thus be provided in a highly space-efficient manner on the basis of a very efficient overall manufacturing flow, as is also described above.

Figure 1I:
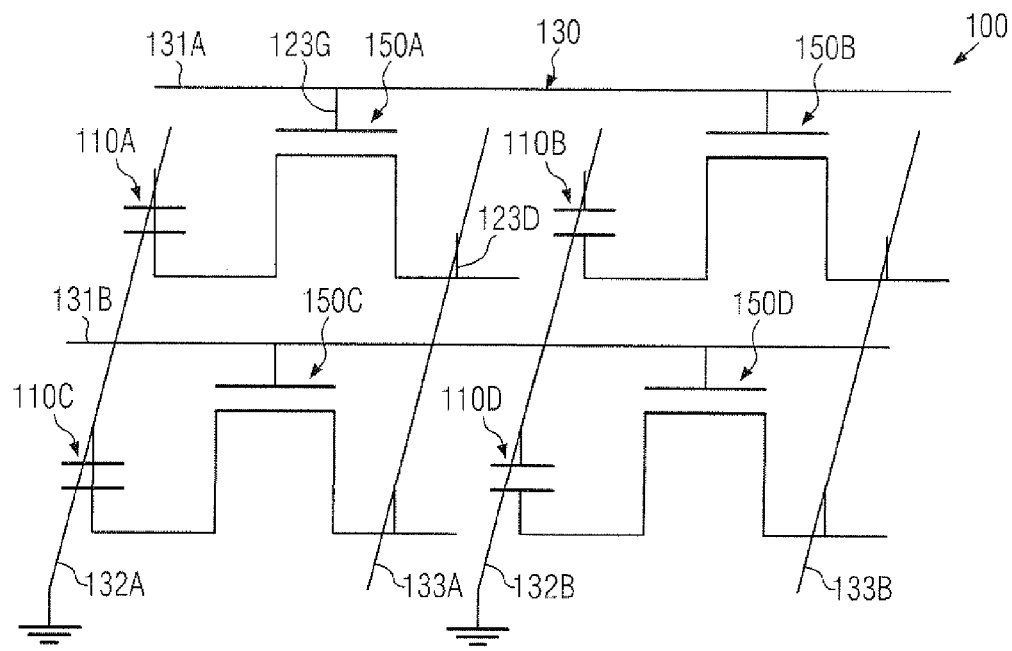
FIG. 1i schematically illustrates a memory area comprising a plurality of transistor/capacitor configurations in the form of a circuit diagram, according to illustrative embodiments.

FIG. 1i schematically illustrates the semiconductor device 100, which may comprise a memory array 130, such as a dynamic RAM array, in which a plurality of capacitor/transistor configurations may be appropriately connected in order to form the memory array 130. As illustrated, a plurality of transistors 150A, 150B, 150C, 150D may be provided which may have any appropriate configuration, as is for instance also described above with reference to FIG. 1g. Furthermore, a respective capacitor 110A, 110B, 110C, 110D may be connected with the corresponding transistor 150A, 150B, 150C, 150D, as is also described above. For example, the transistors 150A, 150B in combination with the capacitors 110A, 110B may represent a corresponding row of memory cells, which may be connected to a word line 131A, which may be accomplished by the contact elements 123G, i.e., by the contact elements connecting to the gate electrode structures of the transistors 150A, 150B. Similarly, the transistors 150C, 150D in combination with the capacitors 110C, 110D may represent a further row of the array 130 and may be connected to a corresponding word line 131B. Furthermore, the transistors 150A, 150C in combination with the capacitors 110A, 110C may represent a column of the array 130 and the corresponding drain regions may be connected via the contact elements 123D. Thus, a bit line 133A may connect the transistors 150A, 150C, while the transistors 150B, 150D representing a further column of the array 130 may be connected by a bit line 133B. Furthermore, the capacitors 110A, 110B, 110C, 110D may be connected to a common reference potential with their electrodes, which may be accomplished via metal lines 132A, 132B. It should be appreciated that the word lines 131A, 131B, the bit lines, 133A, 133B and the lines 132A, 132B may be implemented, for instance, in the metallization system (not shown) of the semiconductor device 100 via the corresponding contact elements and the capacitor electrodes.

Consequently, a high bit density may be obtained in the memory array 130 due to the space-efficient configuration of the capacitors 110A, 110B, 110C, 110D, and due to the very efficient interconnect structure between the capacitors and the transistors.

With reference to FIGS. 1*j*-1*o*, further illustrative embodiments will now be described in which the patterning of contact openings and a capacitor opening may be accomplished in a common process sequence.

Figure 1J:
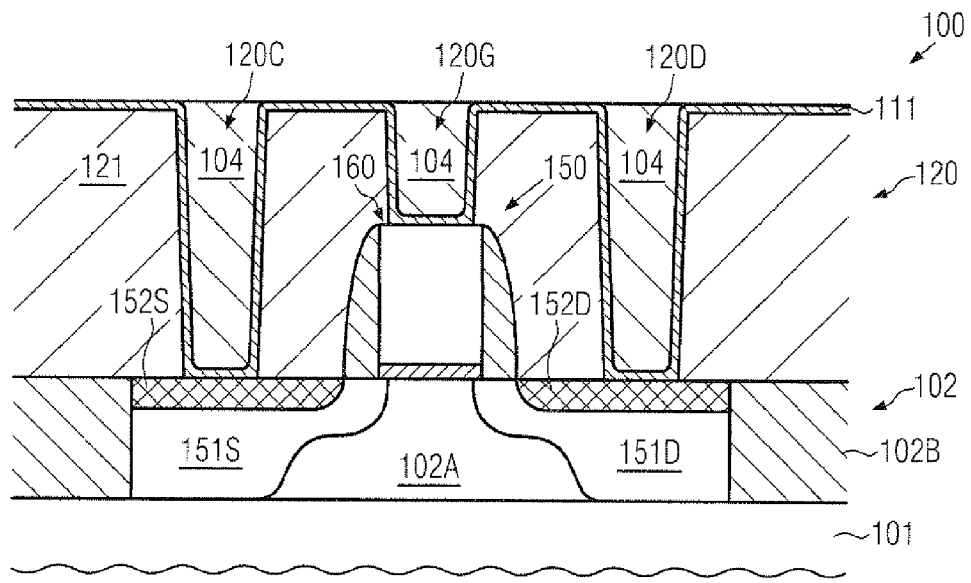
FIGS. 1j-1o schematically illustrate cross-sectional views of the semiconductor device during various manufacturing stages according to further illustrative embodiments in which the contact openings for regular contact elements and capacitor contact elements may be formed in a common patterning sequence.

FIG. 1*j* schematically illustrates the semiconductor device 100 in a manufacturing stage in which the openings 120C, 120G and 120D may be formed in the contact level 120 so as to connect to the contact regions 152S, 152D and to the gate electrode structure 160. To this end, any appropriate patterning regime may be applied on the basis of an appropriate etch mask, which may comprise the corresponding mask openings so as to define the lateral size and position of the openings 120C, 120G and 120D. With respect to any appropriate etch techniques and mask materials, it may be referred to the embodiment described above. Consequently, a corresponding lithography mask and a patterning regime may be applied with a high degree of compatibility with conventional contact regimes. After the patterning of the contact level 120 and after the removal of the etch mask, the processing may be continued by forming the electrode material 111, which may be provided in the form of any appropriate material, such as a highly conductive metal-containing material and the like. As illustrated, the material 111 may thus be formed in any of the openings 120C, 120G and 120D. Next, a sacrificial fill material, such as the fill material 104, may be deposited so as to fill the openings 120C, 120G, 120D, thereby reliably masking the material 111 within these openings.

Figure 1K:
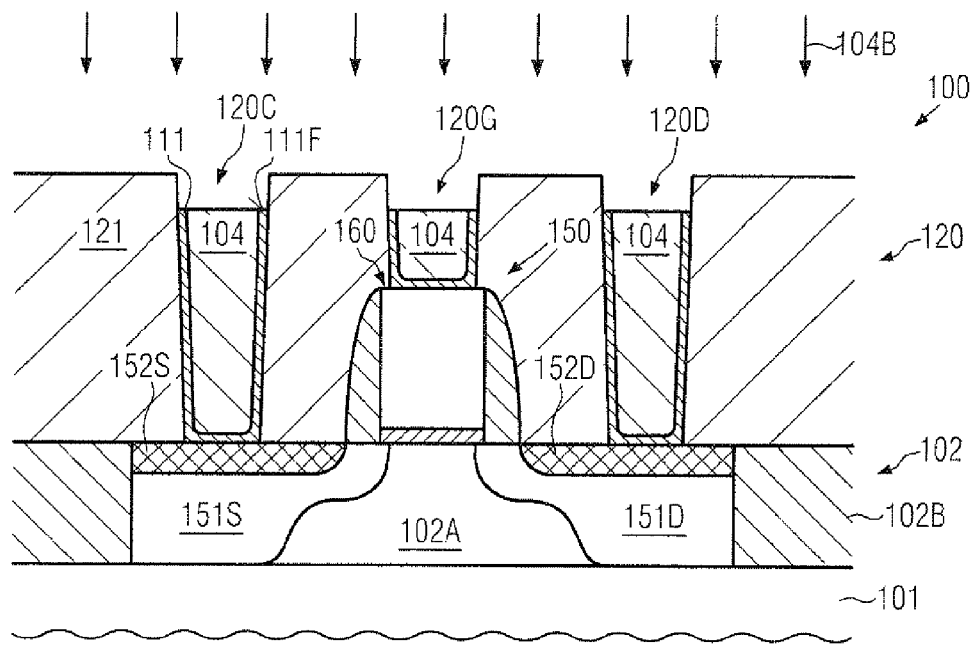

FIG. 1*k* schematically illustrates the semiconductor device 100 in a further advanced manufacturing stage. As illustrated, a material removal process 104B may be applied so as to remove the conductive material 111 from horizontal portions of the contact level 120 and, depending on the process strategy, also within an upper portion of the openings 120C, 120G and 120D. For example, CMP techniques in combination with etch processes may be applied for removing exposed portions of the material 111. For example, a CMP process may be applied and, if required, the further recessing of the end faces 111F may be accomplished by applying an etch process, while, in other cases, a single etch process may be used for removing any unwanted portions of the material 111. The recessing of the end faces 111F may provide superior confinement of the material 111 within the opening 120C during the further processing. In other cases, corresponding recessing may not be required.

Figure 1L:
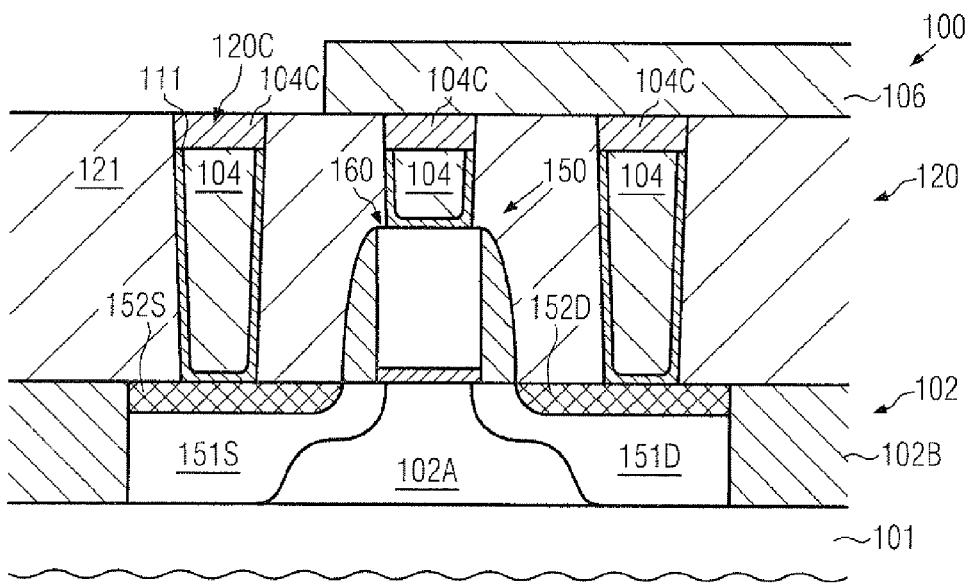

FIG. 1l schematically illustrates the semiconductor device 100 in a further advanced manufacturing stage. As illustrated, if required, a further sacrificial material or planarization material 104C may be provided so as to obtain a superior surface topography for forming an etch mask 106, for instance in the form of a resist material and the like. The fill material 104C may, in some illustrative embodiments, be provided in the form of a polymer material and the like which may have appropriate material characteristics so as to withstand the deposition of a capacitor dielectric material in a later manufacturing stage. To this end, any appropriate material treatment may be performed in order to impart the desired material characteristics to the fill material 104C. The etch mask 106 may be provided on the basis of a lithography process which, however, may be performed on less critical process conditions in terms of alignment accuracy, as only a reliable exposure of the opening 120C and coverage of the remaining contact openings may be required. It should be appreciated that the etch mask 106 may be formed on the basis of any other appropriate material, when the etch resistivity of the mask material may be less pronounced with respect to the sacrificial fill materials 104C and 104. Next, an etch process, such as an oxygen plasma process if the etch mask may be provided in the form of a corresponding material, or any other wet chemical or plasma-assisted etch process, may be applied so as to remove the sacrificial fill materials 104C, 104 from the opening 120C. For example, the etch mask 106 may be provided in the form of amorphous carbon material which may have a high etch resistivity with respect to a plurality of wet chemical etch recipes. Thereafter, the etch mask 106 may be removed by using the materials 111 and 104C as appropriate etch stop materials.

Figure 1M:
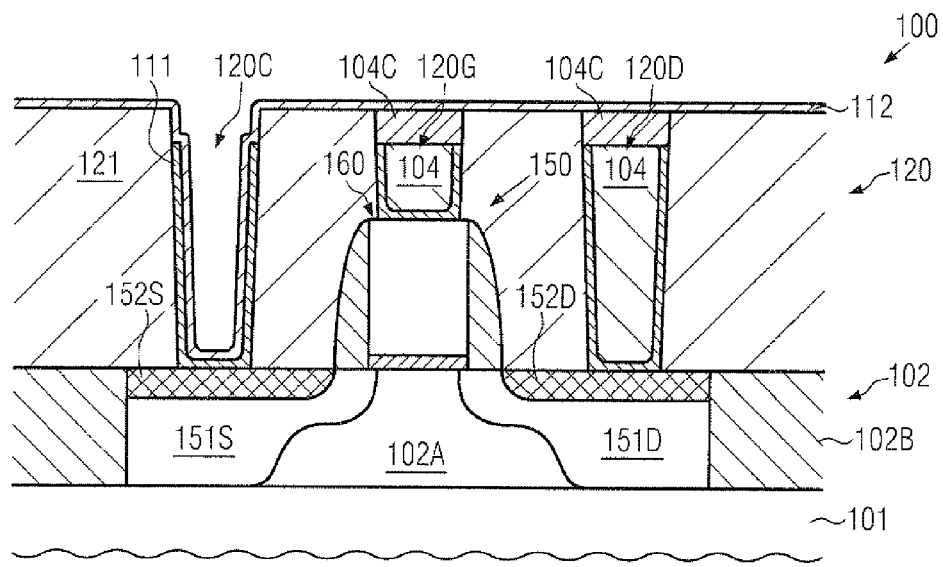

FIG. 1*m* schematically illustrates the semiconductor device 100 in a further advanced manufacturing stage in which the dielectric material 112, for instance in the form of a high-k dielectric material, or any other appropriate dielectric material, may be formed within the opening 120C with a desired thickness, as is also previously discussed, while significant incorporation in the openings 120G, 120D may be avoided due to the presence of the sacrificial fill materials 104C, 104. The dielectric material 112 may be formed on the basis of any appropriate process strategy in which the desired material composition and layer thickness may be obtained within the opening 120C without significantly deteriorating the fill materials 104C so as to substantially completely avoid the deposition of any dielectric material in the openings 120G, 120D. For example, high-k dielectric materials are well-established material systems in sophisticated semiconductor devices and corresponding deposition techniques are well established. In other cases, other CVD techniques may be efficiently used on the basis of deposition temperatures that are compatible with the manufacturing stage of the semiconductor device 100.

Figure 1N:
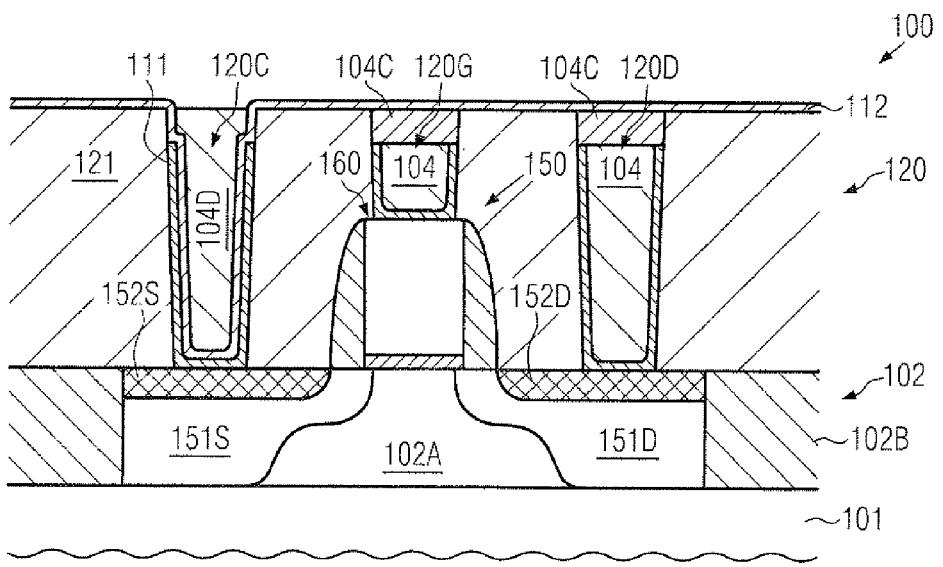

FIG. 1*n* schematically illustrates the semiconductor device 100 in a manufacturing stage in which a further sacrificial fill material 104D may be provided in the opening 120C, which may be accomplished on the basis of any appropriate deposition technique, such as spin-on techniques, by using any appropriate polymer materials and the like. Based on the fill material 104D, the exposed portions of the dielectric layer 112 may be removed, for instance, by CMP, etch processes and the like, wherein integrity of the material 112 within the opening 120C may be preserved by the fill material 104D.

Figure 1O:
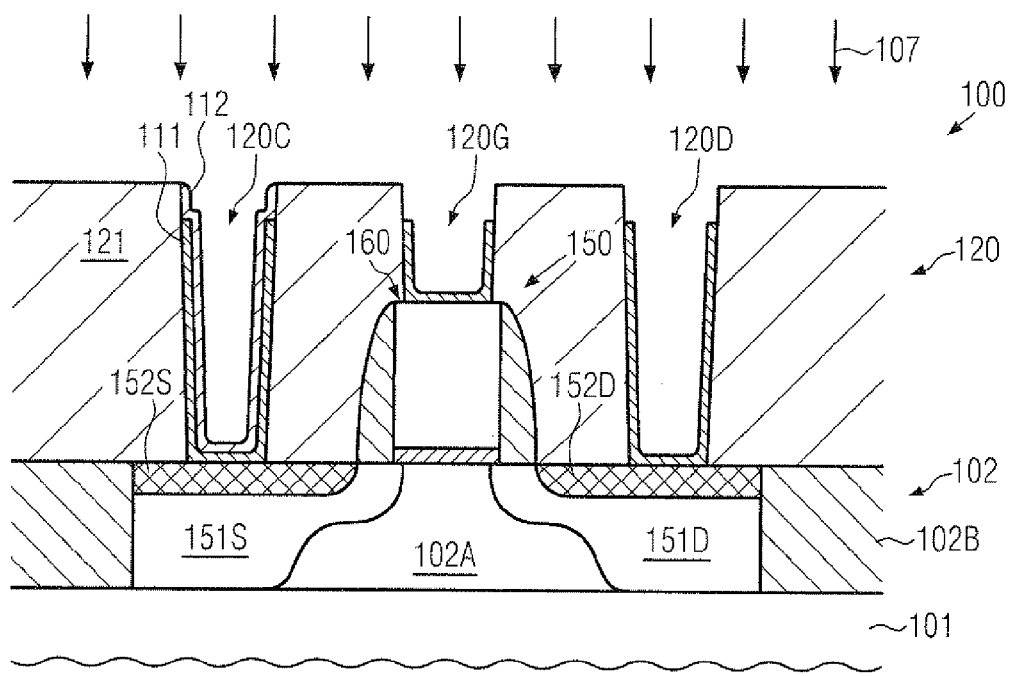

FIG. 1*o* schematically illustrates the semiconductor device 100 in a further advanced manufacturing stage. That is, after removing the exposed portion of the material 112 (FIG. 1*n*), the device 100 may be exposed to a removal process 107, such as a plasma-assisted etch process, a wet chemical etch process in which the sacrificial fill materials in the openings 120C, 120G and 120D may be removed, thereby exposing the dielectric material 112 within the opening 120C. The process 107 may comprise any additional cleaning processes, if required, so as to remove any unwanted residues of the sacrificial fill materials. Thereafter, the processing may be continued by forming an appropriate conductive material in the openings 120C, 120G and 120D in a common process sequence using any appropriate deposition regime, thereby forming contact elements in the openings 120G, 120D, as previously described, while a further electrode may be provided in the opening 120C, thereby completing a corresponding capacitor, as is also discussed above. On the other hand, the electrode 111 may remain reliably confined by the dielectric material 112, which may be provided in the form of any appropriate material, such as a high-k dielectric material, since the material 112 may be restricted to the opening 120C, thereby reducing any negative influence on the final total permittivity of the contact level 120. Thus, a very efficient manufacturing flow may be achieved with a high degree of compatibility with conventional contact regimes, wherein one additional non-critical lithography process may be used for forming the capacitive structure in the opening 120C.

With reference to FIGS. 2a-2d, further illustrative embodiments will now be described in which sophisticated gate electrode structures on the basis of a replacement gate approach may be used in combination with a capacitive structure formed in a contact level of the semiconductor device.

Figure 2A:
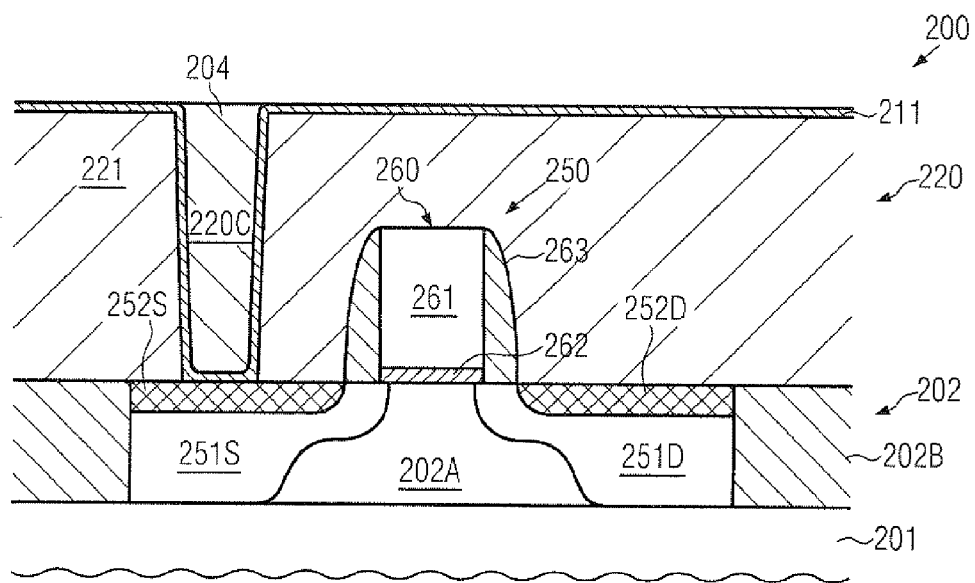
FIGS. 2a-2d schematically illustrate cross-sectional views of a semiconductor device during various manufacturing stages in which the capacitor in the contact level may be formed by using a replacement gate approach, according to still further illustrative embodiments.

FIG. 2a schematically illustrates a semiconductor device 200 comprising a substrate 201, a semiconductor layer 202 including a semiconductor region 202A and an isolation structure 202B, wherein a transistor 250 may be formed in and above the semiconductor region 202A. The transistor 250 may comprise contact regions 252S, 252D, one or both of which may receive a capacitive structure directly connected thereto. Moreover, the transistor 250 may comprise a gate electrode structure 260. With respect to the components described so far, the criteria may apply as previously explained with reference to the semiconductor device 100. Thus, any further detailed description of these components and corresponding manufacturing techniques may be omitted here. The gate electrode structure 260 may comprise a dielectric material 262 and a placeholder material 261, such as a polysilicon material and the like. Furthermore, a spacer structure 263 may be provided on sidewalls of the gate electrode structure 260. Furthermore, the device 200 may comprise a contact level 220 having any appropriate configuration with respect to dielectric materials and the like, as is also previously discussed.

Moreover, in the manufacturing stage shown, an opening 220C may be formed in the contact level 220 so as to connect to the contact region 252S. Furthermore, an electrode material 211 may be formed on the contact level 220 and within the opening 220C, while a sacrificial fill material 204 may preserve integrity of the material 211 within the opening 220C.

The semiconductor device 200 as illustrated in FIG. 2a may be formed on the basis of any of the above-identified process techniques. It should be appreciated, however, that the gate electrode structure 260 may represent a placeholder structure from which at least a portion may be removed and may be replaced by appropriate materials, such as a highly conductive electrode material, possibly in combination with a high-k dielectric material and the like.

Figure 2B:
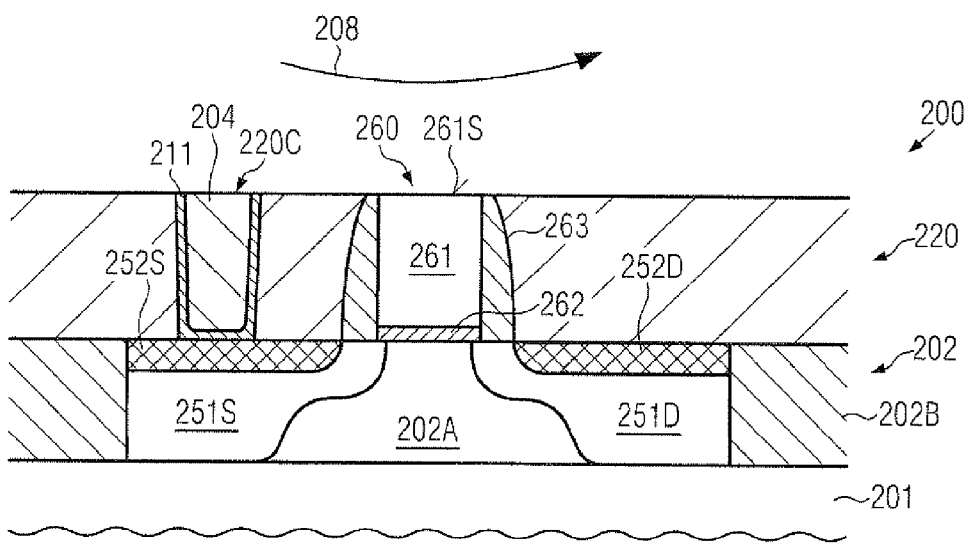

FIG. 2b schematically illustrates the semiconductor device 200 in a further advanced manufacturing stage in which a material removal process or process sequence 208 may be applied so as to remove exposed portions of the material 211 (FIG. 2a) and also remove any excess material of the contact level 220 in order to expose a top surface 261S of the placeholder material 261, which is to be replaced in a later manufacturing stage. For instance, the removal process or process sequence 208 may comprise a CMP process, etch processes and the like, wherein the fill material 204 may substantially avoid any undue degradation of the material 211 within the opening 220C, while, in other cases, a corresponding recessing of the material 204 and thus of the material 211 may intentionally be introduced in order to provide a superior confinement of the material 211 during the further processing.

Figure 2C:
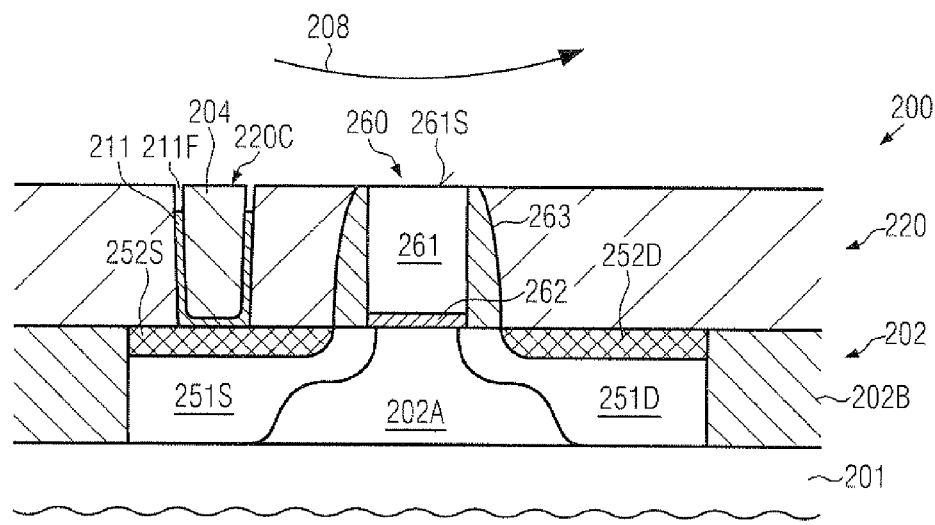

FIG. 2c schematically illustrates the semiconductor device 200 according to illustrative embodiments in which a desired recessing of end faces 211F of the material 211 may be accomplished on the basis of an appropriate etch process, such as a wet chemical etch process, in order to adjust the height of the material 211 within the opening 220C. Next, the material 261 may be removed, which may be accomplished on the basis of highly selective plasma-based or wet chemical etch recipes, for instance using TMAH (tetra methyl ammonium hydroxide), which may efficiently etch silicon material selectively with respect to silicon dioxide, silicon nitride and the like. It should be appreciated that, during the corresponding etch process, the sacrificial fill material 204 may also be removed or reduced, while, however, the material 211 may act as an efficient etch stop material. For example, the material 211 may be provided in the form of titanium nitride and the like, which may have a high etch resistivity with respect to a plurality of wet chemical etch recipes. In other cases, a separate cleaning or removal process may be applied so as to remove the sacrificial fill material 204 prior to or after removing the gate electrode material 261. Consequently, the further processing may be continued by providing an appropriate material system in the opening 220C and within the gate electrode structure 260. For example, in some replacement gate approaches, a high-k dielectric material may be formed, followed by one or more electrode materials, wherein the high-k dielectric material may also be used as a capacitor dielectric within the opening 220C. In other illustrative embodiments, if a high-k dielectric material may already be provided in the gate electrode structure 260, an appropriate dielectric material may be formed after the deposition of the material 211 and prior to forming the sacrificial fill material 204. In this case, the processing may be continued by depositing one or more appropriate electrode materials in the opening 220C and in the gate electrode structure 260 after the removal of the placeholder material 261.

Figure 2D:
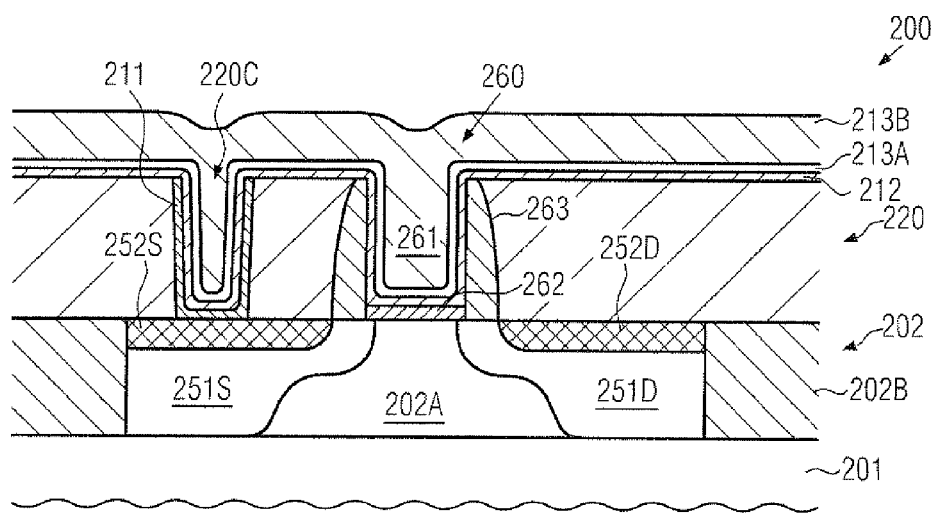

FIG. 2d schematically illustrates the semiconductor device 200 in a further advanced manufacturing stage according to illustrative embodiments in which a high-k dielectric material, possibly in combination with a conventional dielectric material 212, may be formed in the opening 220C and in the gate electrode structure 260 followed by a first electrode material 213A, which may also be appropriate to adjust an appropriate work function for the gate electrode structure 260. Furthermore, a highly conductive fill material 213B, such as aluminum, may be provided in the opening 220C and in the gate electrode structure 260.

The materials 212, 213A, 213B may be provided on the basis of any appropriate process strategy in accordance with established replacement gate approaches, thereby providing a sophisticated gate electrode structure 260, while at the same time an additional electrode for a capacitor in the opening 220C may be provided by the materials 213A, 213B. Thereafter, the processing may be continued by removing any excess material by using CMP techniques and the like, thereby also removing the high-k dielectric material 212, if required, wherein, as previously discussed, the material 211 may reliably remain covered by the material 212 if providing a recessed configuration, as is for instance shown in FIG. 2c.

Thereafter, the further processing may be continued by forming regular contact elements in accordance with corresponding replacement gate approaches.

As a result, the present disclosure provides semiconductor devices and manufacturing techniques in which a capacitive structure may be formed in a highly space-efficient manner so as to directly connect to a contact region of a transistor by forming a capacitive structure in the contact level of the semiconductor device. To this end, one additional lithography process may be applied, thereby achieving a very efficient overall process flow with a high degree of compatibility with respect to conventional contact level pattering regimes. In some illustrative embodiments, the capacitive structure may be formed on the basis of a process strategy that is compatible with sophisticated replacement gate approaches.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first opening in a dielectric material of a contact level of a semiconductor device, said first opening connecting to a first contact region of a transistor;
   forming a conductive material and a capacitor dielectric material on inner surface areas of said first opening;
   forming a second opening in said dielectric material so as to connect to a second contact region of said transistor; and
   forming a conductive material in said first and second openings, wherein forming said conductive material and said capacitor dielectric material comprises forming a layer of said conductive material above said dielectric material and within said first opening and removing said conductive material from said dielectric material outside said first opening prior to forming said capacitor dielectric material, and wherein removing said conductive material from said dielectric material outside said first opening comprises filling said first opening at least partially with a sacrificial fill material and performing a removal process in the presence of said sacrificial fill material.

2. The method of claim 1, wherein forming said capacitor dielectric material comprises depositing a high-k dielectric material.

3. The method of claim 1, wherein said first contact region is one of a drain region and a source region of said transistor.

4. The method of claim 3, further comprising forming a third opening in said dielectric material so as to connect to a gate electrode of said transistor.

5. The method of claim 1, wherein forming said conductive material in said first and second openings comprises performing a deposition process so as commonly fill said first and second openings.

6. A method for forming a capacitive structure of a semiconductor device method comprising:
   forming an opening in a dielectric layer so as to connect to one of a drain region and a source region of a transistor; and
   forming a capacitor in said opening, said capacitor having a first electrode connected to said one of a drain region and a source region, wherein forming said capacitor in said opening comprises forming a first conductive material on at least a portion of inner surface areas of said opening, and wherein forming said first conductive material comprises depositing a layer of said conductive material above said dielectric material and within said opening, filling said opening at least partially with a sacrificial fill material and removing a portion of said layer of a conductive material that is not covered by said sacrificial fill material.

7. The method of claim 6, wherein forming said capacitor further comprises forming a capacitor dielectric material on said first conductive material after removing said portion of said layer of a conductive material.

8. A method for forming a capacitive struture of a semiconductor device, the method comprising:
   forming an opening in a dielectric layer so as to connect to one of a drain region and a source region of a transistor; and
   forming a capacitor in said opening, said capacitor having a first electrode connected to said one of a drain region and a source region, wherein forming said capacitor in said opening further comprises forming a second conductive material in said opening and in at least one further opening formed in said dielectric material in a common process sequence, wherein said at least one further opening connects to said other one of said one of a drain region and a source region of said transistor, and wherein said at least one further opening is formed after forming said opening.

9. The method of claims 6 or 8, further comprising forming a plurality of capacitors including said capacitor, wherein each of said plurality of capacitors connects to one of a drain region and a source region of an associated one of a plurality of transistors including said transistor.

10. The method of claim 9, further comprising connecting said plurality of capacitors and transistors so as to form a memory array.

11. The method of claims 6 or 8, further comprising removing a material from a gate electrode structure of said transistor and forming at least one metal-containing material in said gate electrode structure and said opening by performing a common deposition process.

* * * * *

UNITED STATES PATENT AND TRADEMARK OFFICE
CERTIFICATE OF CORRECTION

| | |
|---|---|
| PATENT NO. | : 8,420,479 B2 |
| APPLICATION NO. | : 12/942378 |
| DATED | : April 16, 2013 |
| INVENTOR(S) | : Dmytro Chumakov |

Page 1 of 1

It is certified that error appears in the above-identified patent and that said Letters Patent is hereby corrected as shown below:

In the Claims:

Col. 16, line 6 (claim 6, line 2), change "device method" to -- device, the method --.

Col. 16, line 25 (claim 8, line 1), change "struture" to -- structure --.

Signed and Sealed this
Fourth Day of June, 2013

Teresa Stanek Rea
*Acting Director of the United States Patent and Trademark Office*